(12) United States Patent
Zhang et al.

(10) Patent No.: US 10,153,310 B2
(45) Date of Patent: Dec. 11, 2018

(54) STACKED-CHIP BACKSIDE-ILLUMINATED SPAD SENSOR WITH HIGH FILL-FACTOR

(71) Applicant: OMNIVISION TECHNOLOGIES, INC., Santa Clara, CA (US)

(72) Inventors: Bowei Zhang, Fremont, CA (US); Vincent Venezia, Los Gatos, CA (US); Gang Chen, San Jose, CA (US); Dyson H. Tai, San Jose, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/213,082

(22) Filed: Jul. 18, 2016

(65) Prior Publication Data
US 2018/0019268 A1   Jan. 18, 2018

(51) Int. Cl.
| H01L 27/144 | (2006.01) |
| H01L 31/0232 | (2014.01) |
| H01L 31/107 | (2006.01) |
| H01L 27/146 | (2006.01) |
| H01L 31/02 | (2006.01) |
| G01J 1/44 | (2006.01) |

(52) U.S. Cl.
CPC ...... *H01L 27/1443* (2013.01); *H01L 27/1464* (2013.01); *H01L 27/14603* (2013.01); *H01L 31/02027* (2013.01); *H01L 31/02327* (2013.01); *H01L 31/107* (2013.01); *G01J 2001/442* (2013.01)

(58) Field of Classification Search
CPC ............. H01L 31/107; H01L 31/02027; H01L 27/14609; H01L 27/1463; H01L 27/14643; H01L 27/14603; H01L 27/1464; G01N 21/6454; H04N 5/369; G01J 2001/442
USPC ......... 257/292, 438, 603, E21.357, E29.335, 257/E31.063; 438/91, 380
See application file for complete search history.

(56) References Cited

U.S. PATENT DOCUMENTS

| 9,178,100 | B2 | 11/2015 | Webster et al. | |
| 9,728,667 | B1* | 8/2017 | Johnson | .............. H01L 31/1075 |
| 2005/0255625 | A1* | 11/2005 | Janesick | ........... H01L 27/14609 |
| | | | | 438/57 |
| 2006/0192086 | A1* | 8/2006 | Niclass | ............. H01L 27/14647 |
| | | | | 250/214.1 |

(Continued)

*Primary Examiner* — David Chen
(74) *Attorney, Agent, or Firm* — Christensen O'Connor Johnson Kindness PLLC

(57) ABSTRACT

A photon detection device includes a single photon avalanche diode (SPAD) disposed in a semiconductor layer. A guard ring structure is disposed in the semiconductor layer surrounding the SPAD to isolate the SPAD. A well region is disposed in the semiconductor layer surrounding the guard ring structure and disposed along an outside perimeter of the photon detection device. A contact region is disposed in the well region only in a corner region of the outside perimeter such that there is no contact region disposed along side regions of the outside perimeter. A distance between an inside edge of the guard ring structure and the contact region in the corner region of the outside perimeter is greater than a distance between the inside edge of the guard ring structure and the side regions of the outside perimeter such that an electric field distribution is uniform around the photon detection device.

22 Claims, 4 Drawing Sheets

(56) References Cited

U.S. PATENT DOCUMENTS

| | | | |
|---|---|---|---|
| 2010/0245809 A1* | 9/2010 | Andreou | H01L 27/14603 356/222 |
| 2012/0025074 A1* | 2/2012 | Barbi | G01T 1/2018 250/307 |
| 2013/0193546 A1* | 8/2013 | Webster | H01L 27/1443 257/438 |
| 2013/0200477 A1* | 8/2013 | Sun | H01L 31/022408 257/431 |
| 2014/0191115 A1* | 7/2014 | Webster | H01L 31/107 250/214 R |
| 2014/0263975 A1* | 9/2014 | Nagano | H01L 27/144 250/208.2 |
| 2014/0291481 A1* | 10/2014 | Zhang | H04N 5/361 250/208.1 |
| 2015/0054111 A1* | 2/2015 | Niclass | H01L 27/1446 257/438 |
| 2017/0176184 A1* | 6/2017 | Lee | G01C 3/02 |
| 2017/0186798 A1* | 6/2017 | Yang | H01L 27/14634 |
| 2018/0195900 A1* | 7/2018 | Delic | H01L 27/14609 |

\* cited by examiner

STACKED-CHIP BACKSIDE-ILLUMINATED SPAD SENSOR WITH HIGH FILL-FACTOR

BACKGROUND INFORMATION

Field of the Disclosure

The present invention relates generally to photodetectors, and more specifically, the present invention is directed to single photon avalanche diode photon sensing systems.

Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these sensors.

One type of photodetector that may be used in an image sensor or in a light detector is a single-photon avalanche diode (SPAD). A SPAD (also sometimes referred to as a Geiger-mode avalanche photodiode (G-APD)) is a solid-state photodetector capable of detecting a low intensity signal, such as low as a single photon. SPAD imaging sensors are semiconductor photosensitive devices made up of an array of SPAD regions that are fabricated on a silicon substrate. The SPAD regions produce an output pulse when struck by a photon. The SPAD regions have a pn junction that is reverse biased above the breakdown voltage such that a single photo-generated carrier can trigger an avalanche multiplication process that causes current at the output of the photon detection cell to reach its final value quickly. This avalanche current continues until a quenching element is used to quench the avalanche process by reducing the bias voltage. The photon signal received by the image sensor can be detected and measured with support circuitry to count output pulses from the SPAD regions within a window of time to measure the intensity of the incident light, time the arrival of the incident light, provide optical communications, or a variety of other optical applications.

A conventional SPAD sensor pixel consists of both the avalanche diode and the corresponding support circuitry. The fill factor of a photon detection array of SPADs is very low mainly due to large size of the circuitry required to support the SPADs. In a stacked sensor with pixel-level connections, only SPADs are included in the sensor wafer and the support circuitry is located in a separate wafer. However, because SPAD sensors operate at high voltages typically, such as ~30V range, the guard rings that surround the SPADs are large (e.g., µm level). As the pixels get smaller (e.g., less than 10 µm), the large sizes of the guard rings severely impact the sensor fill factor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
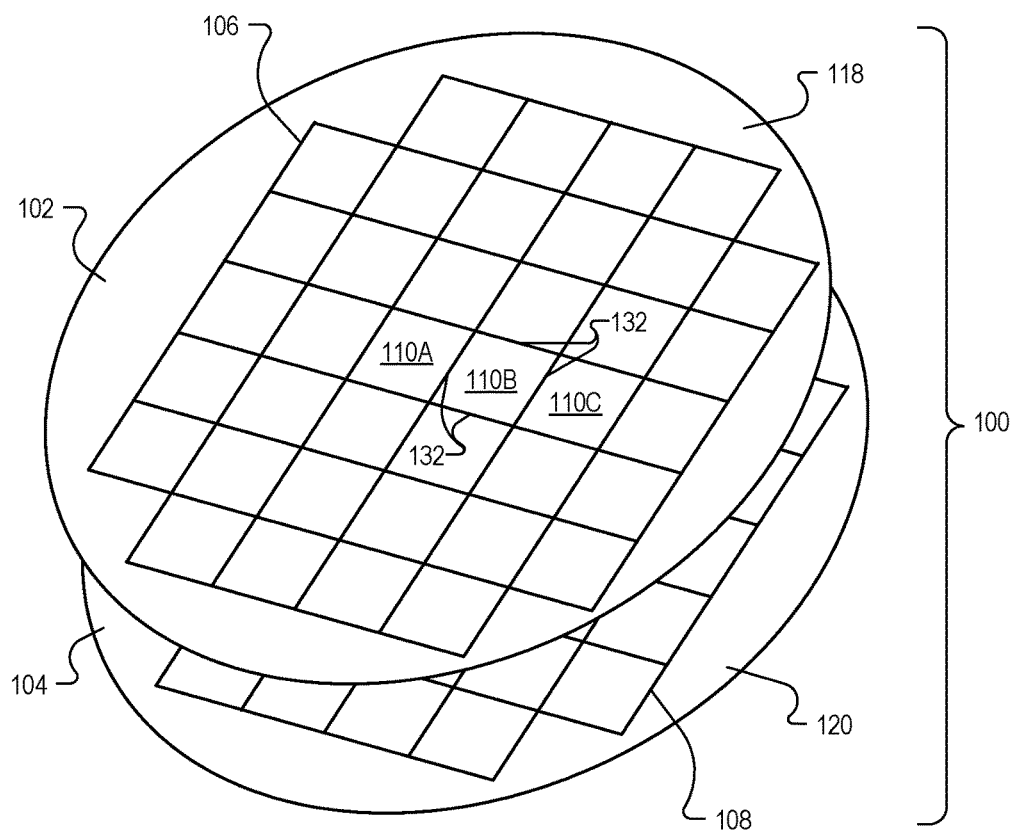
FIG. 1 is an exploded view of one example of stacked semiconductor device wafers with integrated circuit dies of an example single photon avalanche diode (SPAD) photon sensing system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale. Furthermore, the particular features, structures, or characteristics may be combined in any suitable manner in one or more embodiments. Directional terminology such as "top", "down", "above", "below" are used with reference to the orientation of the figure(s) being described.

As will be discussed, examples in accordance with the teaching of the present invention describe a photon sensing system that includes an array of photon detection devices with single photon avalanche diodes (SPADs) in a stacked chip photon sensing system. In the depicted examples, the highly doped contact regions to bias the SPADs are only in the corners of the inactive isolation well regions along the outside perimeters of the photon detection devices. Thus, there are no highly doped contact regions along the side regions of the outside perimeters photon detection devices. Without the need for highly doped contact regions along the side regions of inactive isolation well regions along the outside perimeters of the photon detection devices, the overall dimensions of the photon detection device may be reduced, and therefore make possible an increase in the fill factor in a photon sensing system that includes photon detection devices in accordance with the teachings of the present invention. In the examples, since there are no highly doped contact regions along the side regions, the guard ring structures surrounding the SPADs are specially shaped, with increased distances to the contact regions compared to the distances to the side regions of the photon detection devices, to provide a uniform electric field across the entire SPAD structure. In various examples, the number of contact regions in the corner regions of the outside perimeters of the photon detection devices may be as few as one for each SPAD. In addition, in various examples, each one of the contact regions may also be optionally shared between one or more neighboring photon detection devices. Furthermore, in various examples, a retrograde well implant can be included the inactive well regions along the side regions of the outside perimeters photon detection devices to provide low resistance paths to the semiconductor material across the entire photon detection device structure.

To illustrate, FIG. 1 is an exploded view of one example of stacked semiconductor device wafers 102 and 104 with integrated circuit dies of an example single photon avalanche diode (SPAD) photon sensing system 100 in accordance with the teachings of the present invention. In various examples, semiconductor device wafers 102 and 104 may include silicon, gallium arsenide, or other suitable semiconductor materials. In the illustrated example, device wafer 102 is a top sensor chip that includes a photon detection array 106 having a plurality of photon detection devices including SPADs 100A, 110B, 100C, etc., in accordance with the teachings of the present invention. Device wafer 102 is stacked with device 104, which includes support circuitry 108 disposed in a second semiconductor layer 120 and coupled to the photon detection array 106 to support operation of the photon detection array 106. As will be discussed in more detail below, in some examples, the highly doped contact regions to bias the SPADs 100A, 110B, 110C, etc., are only in corner regions in well regions along the outside perimeters 132 of the SPAD structures. Thus, there are no highly doped contact regions in the side regions in the well regions along the outside perimeters 132 of the SPAD structures. Without the need for highly doped contact regions along the side regions of the outside perimeters 132 of the SPAD structures, the overall dimensions of the photon detection devices that include the SPADs may be reduced, and therefore make possible an increased the fill factor in a photon sensing system that includes SPAD photon detection array 106 in accordance with the teachings of the present invention. In addition, the placement of the support circuitry 108 on the separate bottom device wafer 104 further allows for a very high fill factor in the SPAD photon detection array 106 on the top device wafer 102. Moreover, since device wafer 102 is formed separately from device wafer 104, custom fabrication processes may be utilized to optimize the formation of the SPAD 110A, 110B, 110C, etc., regions in the SPAD photon detection array 106 on device wafer 102, while traditional CMOS processes may be retained when forming the CMOS support circuitry 108 on the device wafer 104 in accordance with the teachings of the present invention.

It is noted that the example SPAD photon sensing system 100 shown in FIG. 1 is illustrated with two stacked semiconductor device wafers 102 and 104 for explanation purposes. In other examples, it is appreciated that SPAD photon sensing system 100 may include more than two stacked semiconductor device wafers for additional functions, features, and improved performance in accordance with the teachings of the present invention.

Figure 2:
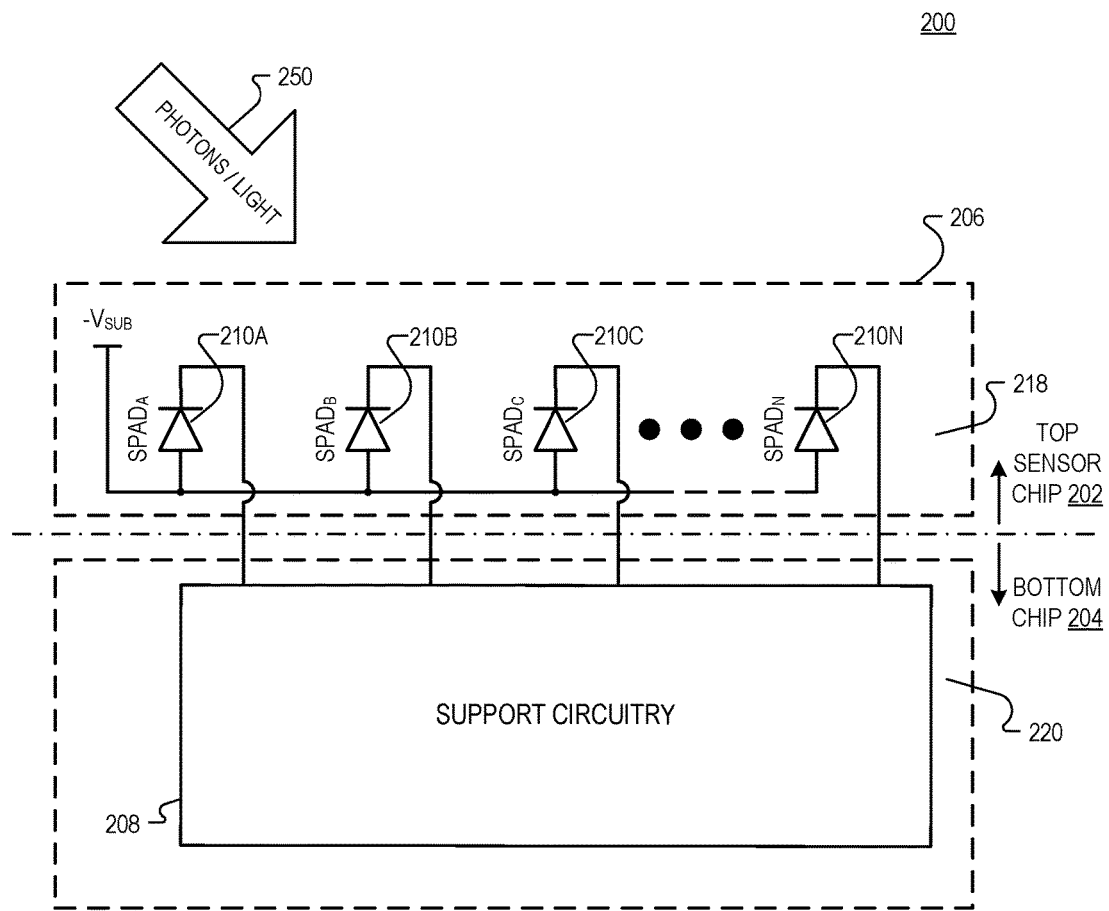
FIG. 2 is a circuit diagram illustrating one example of a stacked chip system including a photon detection array of SPADs in a top sensor chip that is stacked with a bottom chip including support circuitry in accordance with the teachings of the present invention.

FIG. 2 is a circuit diagram illustrating one example of a stacked chip photon sensing system 200 including a photon detection array 206 of SPADs in a top sensor chip 202 that is stacked with a bottom integrated circuit chip 204 including support circuitry 208 in accordance with the teachings of the present invention. It is appreciated that stacked chip photon sensing system 200 may be one example of an implementation of stacked chip photon sensing system 100 of FIG. 1, and that similarly named and numbered elements referenced below are coupled and function similar to as described above. In the depicted example, photon sensing system 200 includes a photon detection array 206 with SPAD photon detection devices including $SPAD_A$ 210A, $SPAD_B$ 210B, $SPAD_C$ 210C, ... $SPAD_N$ 210N disposed in a first semiconductor layer 218 of top sensor chip 202. In the example depicted in FIG. 2, support circuitry 208 disposed in a second semiconductor layer 220 of a bottom chip 204 is coupled to photon detection array 206 to support operation of $SPAD_A$ 210A, $SPAD_B$ 210B, $SPAD_C$ 210C, ... $SPAD_N$ 210N. For instance, in one example, the support circuitry 208 may be implemented using an application specific integrated circuit (ASIC) chip 204, which may include for instance quenching circuitry coupled to each respective $SPAD_A$ 210A, $SPAD_B$ 210B, $SPAD_C$ 210C, ... $SPAD_N$ 210N. In the example, support circuitry 208 may also include other circuitry coupled the quenching circuitry such as for example time to digital converter (TDC) circuitry, counter circuitry, timing circuitry, readout circuitry, control circuitry, functional logic, or other well-known SPAD support circuitry, which are not shown or described in detail to avoid obscuring certain aspects in accordance with the teachings of the present invention. In addition, it is noted that the example depicted in FIG. 2, $SPAD_A$ 210A, $SPAD_B$ 210B, $SPAD_C$ 210C, ... $SPAD_N$ 210N are illustrated as being arranged in a single row. However, in other examples, it is appreciated that pixels of the pixel array may be arranged into a single column, or into a two-dimensional array of columns and rows.

In the example depicted in FIG. 2, it is noted that the anode of each $SPAD_A$ 210A, $SPAD_B$ 210B, $SPAD_C$ 210C, ... $SPAD_N$ 210N is illustrated as being biased with a highly negative voltage $-V_{SUB}$, and that the pixel voltage at the cathode of each $SPAD_A$ 210A, $SPAD_B$ 210B, $SPAD_C$ 210C, ... $SPAD_N$ 210N is coupled to be readout through support circuitry 208 from bottom chip 204. When the SPADs of photon detection array 206 are illuminated with photons/light 250, the resulting output pulses from $SPAD_A$ 210A, $SPAD_B$ 210B, $SPAD_C$ 210C, $SPAD_N$ 210N are sensed through support circuitry 208 to measure and/or time the arrival of incident photons/light 250 in accordance with the teachings of the present invention. In one example, photons/light 250 is directed through a back side of the semiconductor material of first semiconductor layer 218 to illuminate the SPADs of photon detection array 206. In the illustrated example, each $SPAD_A$ 210A, $SPAD_B$ 210B, $SPAD_C$ 210C, . . . $SPAD_N$ 210N is reverse biased above the breakdown voltage of each $SPAD_A$ 210A, $SPAD_B$ 210B, $SPAD_C$ 210C, . . . $SPAD_N$ 210N. In response to a single photogenerated carrier from incident photons/light 250, an avalanche multiplication process is triggered that causes an avalanche current at the output of each $SPAD_A$ 210A, $SPAD_B$ 210B, $SPAD_C$ 210C, . . . $SPAD_N$ 210N. This avalanche current self-quenches in response to a voltage drop that is developed across the respective quenching element (e.g., included in support circuitry 208), which causes the bias voltage across the SPAD to drop. After the quenching of the avalanche current, the voltage across the SPAD recovers to above the bias voltage and then the SPAD is ready to be triggered again. The resulting output pulse from each SPAD is received by support circuitry 208, which can measure the time of arrival of each photon of incident photons/light 250 in accordance with the teachings of the present invention.

Conventional SPAD designs that incorporate SPADs on the same chips as the SPAD support circuitry fabricated using a standard CMOS process suffer from reduced fill factor on the imaging plane due to the area occupied by the CMOS circuits themselves. Accordingly, one advantage of implementing a stacked chip structure in accordance with the teachings of the present invention is that with the SPADs on the top chip and with the support circuitry on a separate bottom chip, the fill factor of the SPAD imaging array on the top chip does not need to be reduced in order to provide room to accommodate the CMOS circuitry on the same chip in accordance with the teachings of the present invention. Indeed, as was discussed previously with respect to the example SPAD photon sensing system 100 shown in FIG. 1, it is noted that stacked chip photon sensing system 200 shown in FIG. 2 is also illustrated with two stacked semiconductor device wafers 202 and 204 for explanation purposes. In other examples, it is appreciated that SPAD photon sensing system 200 may also include more than two stacked semiconductor device wafers for additional functions, features, and improved performance in accordance with the teachings of the present invention.

Figure 3:
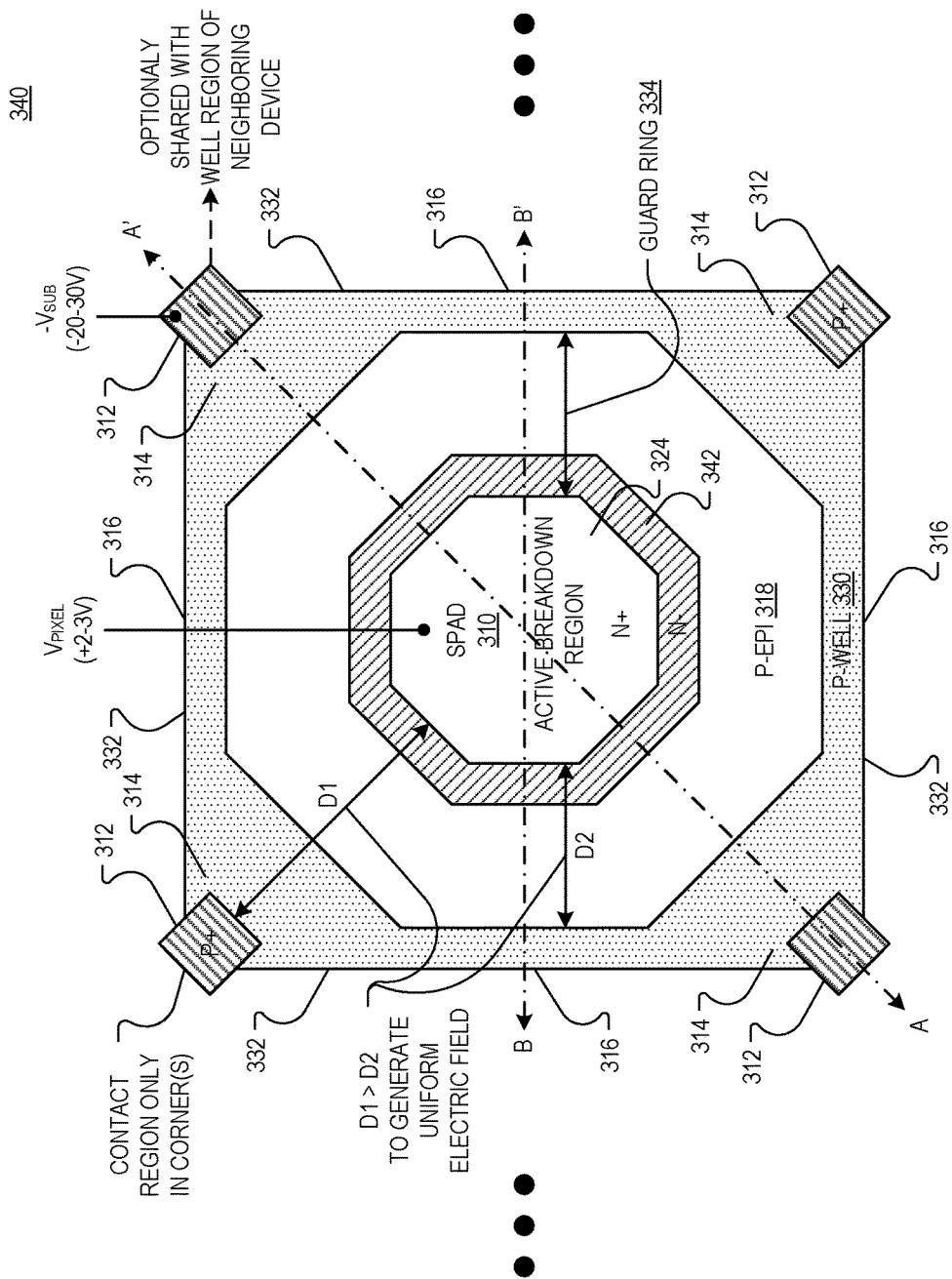
FIG. 3 is a top view of one example of a photon detection device including a SPAD in which the highly doped contact regions are only at corner regions, which reduces the width of the photon detection device and increases the fill factor of a photon sensing system including photon detection devices in accordance with the teachings of the present invention.

FIG. 3 is a top view of one example of a SPAD 310 included in a photon detection device 340 that is included in a photon detection array, in which the highly doped contact regions are only at corner regions of the outside perimeter, which reduces the overall width of the photon detection device 340 and increases the fill factor of a photon sensing system including photon detection devices in accordance with the teachings of the present invention. It is appreciated that SPAD 310 of FIG. 3 may be one example of an implementation of SPADs 110A, 110B, 110C of FIG. 1, or of $SPAD_A$ 210A, $SPAD_B$ 210B, $SPAD_C$ 210C, . . . $SPAD_N$ 210N of FIG. 2, and that similarly named and numbered elements referenced below are coupled and function similar to as described above. The example photon detection device 340 depicted in FIG. 3 includes a SPAD 310 that is disposed in an active region of a first semiconductor layer 318. In one example, the first semiconductor layer 318 is a p-doped epitaxial layer (i.e., P-EPI) of silicon, which as will be discussed in greater detail below, is biased with a highly negative voltage $-V_{SUB}$ through one or more contact regions 312 disposed only in corner regions 314 of a well region 330 disposed along an outside perimeter 332 of photon detection device 340 as shown. In one example, the negative voltage $-V_{SUB}$ is a high negative voltage, such as for example −20-30V. In one example, the well region 330 is a p-doped well region (i.e., P-WELL), and the one or more contact regions 312 are p+ doped. In the example, well region 330 provides an inactive p− isolation region and also helps to prevent punch-through between neighboring photon detection devices or pixels.

Continuing with the depicted example, a guard ring structure 334 is disposed in the first semiconductor layer 318 surrounding the SPAD 310 to isolate the SPAD 310 inside the guard ring structure 334. In one example, the guard ring structure 334 includes an n-doped region 342 disposed in the first semiconductor layer 318 along an inside edge of the guard ring structure 334 proximate to SPAD 310. In one example, an n doped region (not shown) may also be included in first semiconductor layer 318 at the lateral transition between an n+ doped layer 324 of SPAD 310 and the n-doped region 342 of guard ring structure 334. In the depicted example, guard ring structure 334 is defined in first semiconductor layer 318 between the inside edge of n-doped region 342 and well region 330. The well region 330 is therefore disposed in the first semiconductor layer 318 surrounding the guard ring structure 334, and disposed along the outside perimeter 332 of the photon detection device 340. The one or more contact regions 312 are disposed in the well region 330 only in the corner region 314 of the outside perimeter 332 such that there is no contact regions 312 disposed along any of the side regions 316 of the outside perimeter 332. For purposes of this disclosure, the side regions 316 may include any region along the outside perimeter 332 of the well region 330 that are not in the corner regions 314 in which the contact regions 312 are disposed.

In the depicted example, SPAD 310 includes the n+ doped layer 324, as shown, and an underlying p doped layer that define a multiplication junction at an interface between n+ doped layer 324 and the p doped layer, which will be described in greater detail below. The anode of SPAD 310 is biased with negative voltage $-V_{SUB}$, and the pixel voltage $V_{PIXEL}$ at the cathode of SPAD 310 is biased in one example to be 2-3V. As such, the multiplication junction in the active breakdown region at the interface between n+ doped layer 324 and the p+ doped layer is reversed biased above a breakdown voltage such that photons that are directed into the SPAD 310, or photogenerated electrons that drift into SPAD 310 from the first semiconductor layer 318, trigger an avalanche multiplication process in the multiplication junction. The output pulse generated as a result of the avalanche multiplication process in SPAD 310 can be sensed in $V_{PIXEL}$ the cathode of SPAD 310 by support circuitry, which in one example may be included in a second semiconductor layer on a separate stacked chip.

It is noted that the example SPAD 310 of FIG. 3 is implemented in a p-doped epitaxial layer (i.e., P-EPI) for explanation purposes. In other examples, it is appreciated that SPAD 310 may also be implemented in an n-doped epitaxial layer (e.g., N-EPI) having opposite polarities in accordance with the teachings of the present invention. In these other examples, oppositely biased implant species or dopants may be utilized to implement the SPAD in accordance with the teachings of the present invention.

As shown in the example depicted in FIG. 3, the contact distance, or a first distance D1, between the inside edge of the guard ring structure 334 and the contact region 312 in the corner region 314 of the outside perimeter 332 is greater than a second distance D2 between the inside edge of the guard ring structure 334 and the side regions 316 of the outside perimeter 332 of the well region 330 of photon detection device 340. As such, an electric field distribution around the photon detection device 340 is uniform in accordance with the teachings of the present invention. For instance, in the illustrated example, the four corner regions 314 have a higher magnitude e-potential than the four side regions 316. With the increased contact distance D1 between the inside edge of the guard ring structure 334 and the contact region 312 in the corner region 314, the breakdown voltage at the four corners is therefore aligned with the breakdown voltage at the four sides of SPAD 310 with the uniform e-potential field in accordance with the teachings of the present invention.

It is noted that in the depicted example, four contact regions 312 are illustrated for explanation purposes. However, in other examples, it is appreciated that the number of corner contact regions 312 could be as few as one for each SPAD 310. In addition, it is noted that in other examples, a corner contact region 312 may optionally be shared with a well region of a neighboring photon detection device in accordance with the teachings of the present invention. In such an example, the shared corner contact region 312 may be used to provide the highly negative bias voltage $-V_{SUB}$ for a plurality of SPADs 310 in accordance with the teachings of the present invention.

Thus, it is appreciated that since the contact regions 312 are only in the corner regions 314, there is no highly doped p+ region along the side regions 316 along the outside perimeter 332 of well region 330. As such, the required area for guard ring structures 334 may be reduced, and the inactive width or dimensions of each pixel including photon detection device 340 is reduced by the p+ width, which increases the fill factor of a photon sensing system including photon detection devices 340 in accordance with the teachings of the present invention.

Figure 4A:
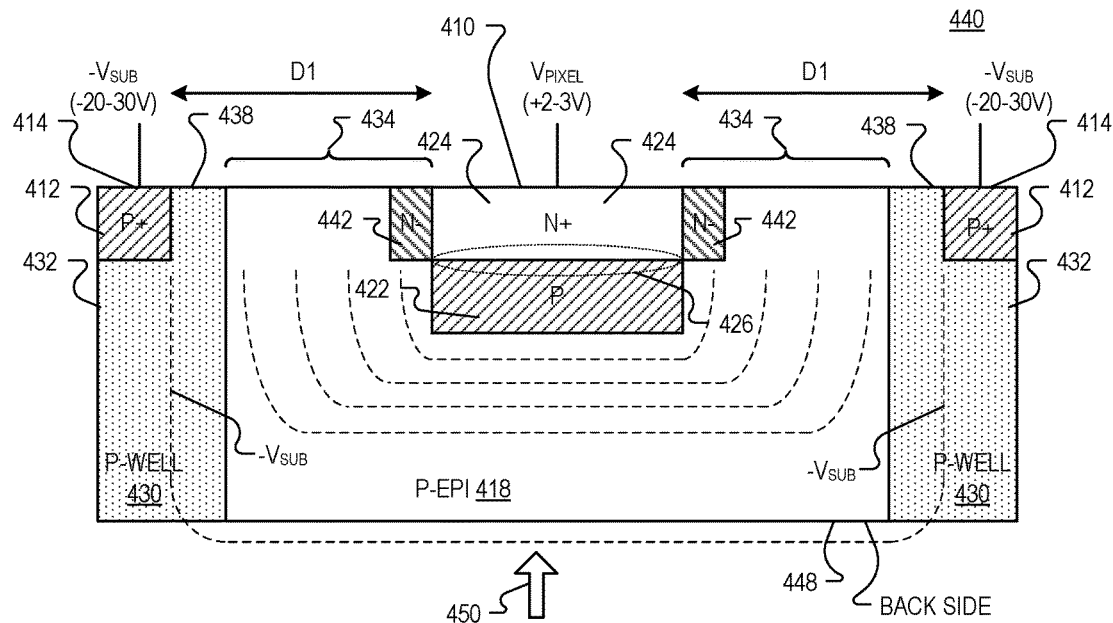
FIG. 4A is a cross-sectional view of one example of a photon detection device along a diagonal between corner regions of the photon detection device in accordance with the teachings of the present invention.

FIG. 4A is a cross-sectional view of one example of a photon detection device 440 along a diagonal between corner regions 414 of the photon detection device in accordance with the teachings of the present invention. It is appreciated that photon detection device 440 of FIG. 4A may be one example of an implementation of photon detection device 340 of FIG. 3, and that similarly named and numbered elements referenced below are coupled and function similar to as described above. In particular, the example photon detection device 440 depicted in FIG. 4 corresponds to a cross-sectional view along dashed line A-A' between corner regions 314 shown in FIG. 3.

As shown in the depicted example, photon detection device 440 includes a SPAD 410 that is disposed in an active region of a first semiconductor layer 418, which is a p-doped epitaxial layer (i.e., P-EPI) of silicon. In the depicted example, SPAD 410 includes an n+ doped layer 424 and an underlying p doped layer 422, which define a multiplication junction 426 at the interface between n+ doped layer 424 and p doped layer 422. The anode of SPAD 410 is biased with negative voltage $-V_{SUB}$ through first semiconductor layer 418 and well region 430 from contact region 412, and the pixel voltage $V_{PIXEL}$ at the cathode of SPAD 410 is biased in one example to be 2-3V. As such, the multiplication junction 426 at the interface between n+ doped layer 424 and the p doped layer 422 is reversed biased above a breakdown voltage such that photons 450 that are directed into the SPAD 410, or photogenerated electrons that drift into SPAD 410 from the first semiconductor layer 418, trigger an avalanche multiplication process in the multiplication junction. In one depicted example, the photons 450 are directed through a back side 448 of first semiconductor layer 418. The output pulse generated as a result of the avalanche multiplication process in SPAD 410 can be sensed in $V_{PIXEL}$ at the cathode of SPAD 410 by support circuitry included in a second semiconductor layer of a separate stacked chip.

Continuing with the depicted example, a guard ring structure 434 is disposed in the first semiconductor layer 418 surrounding the SPAD 410 to isolate the SPAD 410 inside the guard ring structure 434. In one example, the guard ring structure 434 includes an n-doped region 442 disposed in the first semiconductor layer 418 along an inside edge of the guard ring structure 434 around SPAD 410 as shown. In one example, an n doped region (not shown) may also be included in first semiconductor layer 418 at the lateral transition between the n+ doped layer 424 of SPAD 410 and the n-doped region 442 of guard ring structure 434. In the depicted example, guard ring structure 434 is laterally defined in first semiconductor layer 418 from the active breakdown region of SPAD 410, between the inside edge of n-doped region 442 and a well region 430, disposed in the first semiconductor layer 418 surrounding the guard ring structure and disposed along an outside perimeter 432 of the photon detection device 440. In other words, the well region 430 is therefore disposed in the first semiconductor layer 418 surrounding the guard ring structure 434, and disposed along the outside perimeter 432 of the photon detection device 440. As shown in the example, one or more contact regions 412 are disposed in the well region 430 only in the corner region 414 of the outside perimeter 432.

As shown in the depicted example, one or more contact regions 412 are disposed in respective corner regions 414 of the well region 430 along the outside perimeter 432. In the example, the high negative voltage $-V_{SUB}$ (e.g., -20-30V) is coupled to contact regions 412 to bias SPAD 410. The contact distance, or the distance between the inside edge of guard ring structure 434 and contact region 412 is a first distance D1.

The example depicted in FIG. 4A also illustrates potential contour lines with dashed lines, which show that the voltage potential is less negative in the first semiconductor layer 418 towards the center of photon detection device 440, and becomes more negative laterally extending outward from the $V_{PIXEL}$ biased n+ doped layer 424 of SPAD 410 towards the $-V_{SUB}$ biased contact regions 412 in corner regions 414. As such, the voltage at the surface 438 of well region 430 in corner regions 414 is substantially equal to the high negative voltage $-V_{SUB}$ as shown.

Figure 4B:
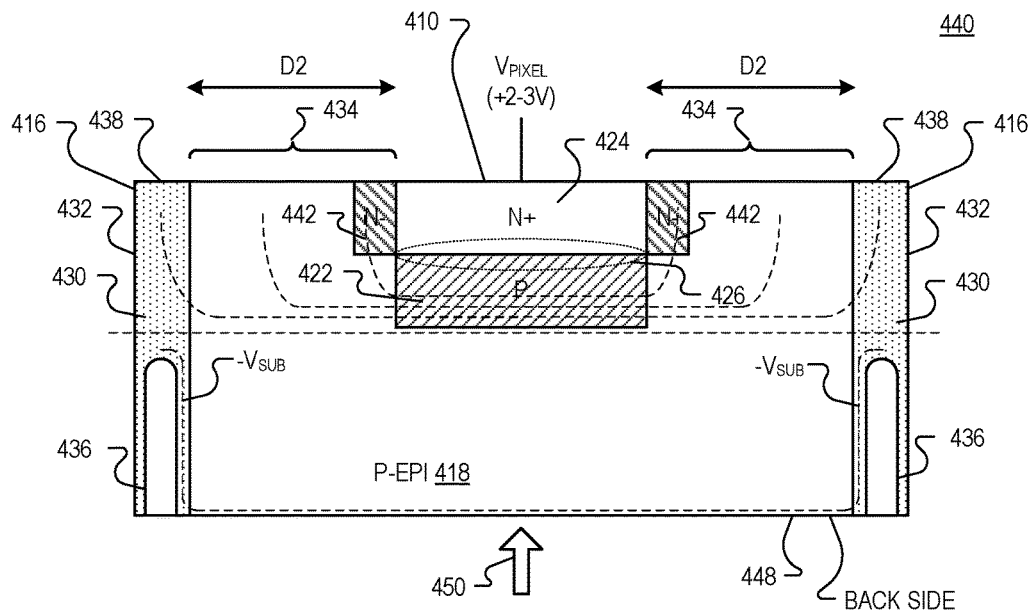
FIG. 4B is a cross-sectional view of one example of a photon detection device between opposite side regions of the photon detection device in accordance with the teachings of the present invention.

Referring now to FIG. 4B, a cross-sectional view of one example of a photon detection device 440 between opposite side regions 416 of the photon detection device is illustrated in accordance with the teachings of the present invention. It is appreciated that photon detection device 440 of FIG. 4B may also be one example of an implementation of photon detection device 340 of FIG. 3, and that similarly named and numbered elements referenced below are coupled and function similar to as described above. In particular, the example photon detection device 440 depicted in FIG. 4B corresponds to a cross-sectional view along dashed line B-B' between side regions 316 shown in FIG. 3.

As shown in the depicted example, photon detection device 440 includes SPAD 410 that is disposed in the active region of first semiconductor layer 418, which is a p-doped epitaxial layer (i.e., P-EPI) of silicon. In the depicted example, SPAD 410 includes n+ doped layer 424 and underlying p doped layer 422, which define multiplication junction 426 at the interface between n+ doped layer 424 and p doped layer 422. The anode of SPAD 410 is biased with negative voltage $-V_{SUB}$ through first semiconductor layer 418 and well region 430 from contact region 412, and the pixel voltage $V_{PIXEL}$ at the cathode of SPAD 410 is biased in one example to be 2-3V. As such, the multiplication junction 426 at the interface between n+ doped layer 424 and the p doped layer 422 is reversed biased above the breakdown voltage of SPAD 410 such that photons 450 that are directed into the SPAD 410, or photogenerated electrons that drift into SPAD 410 from the first semiconductor layer 418, trigger an avalanche multiplication process in the multiplication junction 426. In the depicted example, the photons 450 are directed through back side 448 of first semiconductor layer 418. The output pulse generated as a result of the avalanche multiplication process in SPAD 410 can be sensed in $V_{PIXEL}$ at the cathode of SPAD 410.

Continuing with the depicted example, guard ring structure 434 is disposed in the first semiconductor layer 418 surrounding the SPAD 410 to isolate the SPAD 410 inside the guard ring structure 434. In one example, an n doped region (not shown) may also be included in first semiconductor layer 418 at the lateral transition between the n+ doped layer 424 of SPAD 410 and the n-doped region 442 of guard ring structure 434. In the depicted example, guard ring structure 434 includes n-doped region 442 disposed in the first semiconductor layer 418 along an inside edge of the guard ring structure 434 around SPAD 410 as shown. Thus, in the depicted example, guard ring structure 434 is laterally defined in first semiconductor layer 418 from the active breakdown region of SPAD 410, between the inside edge of n-doped region 442 and well region 430, disposed in the first semiconductor layer 418 surrounding the guard ring structure 434 and disposed along an outside perimeter 432 of the photon detection device 440. In other words, the well region 430 is therefore disposed in the first semiconductor layer 418 surrounding the guard ring structure 434, and disposed along the outside perimeter 432 of the photon detection device 440. As shown in the example, one or more contact regions 412 are disposed in the well region 430 only in the corner regions 414 of the outside perimeter 432.

As shown in the depicted example, there are no contact regions 412 disposed in any of the side regions 416 of the well region 430 along the outside perimeter 432. With the elimination for the need of any contact regions 412 in the side regions 416, it is appreciated that the width or dimensions of well region 430 may be reduced in side regions 416, which reduces the overall width or dimensions of photon detection device 440 and therefore makes possible an increased fill factor in a photon sensing system that includes photon detection devices 440 in accordance with the teachings of the present invention.

With the elimination of contact regions 412 in the side regions 416, the distance between the inside edge of guard ring structure 434 and the side regions 416 of well region 430 along the outside perimeter 432 is equal to a second distance D2 as shown. In the example, the first distance D1, shown in FIG. 4A, is greater than the second distance D2, shown in FIG. 4B, such that an electric field distribution is uniform around the photon detection device 440 in accordance with the teachings of the present invention.

In one example, well region 430 may be provided with a retrograde p-well implant 436 only along the side regions 416 of the outside perimeter 432. In other words, the retrograde p-well implant 436 is not provided in any of the corner regions 414. In the depicted example, the retrograde p-well implant 436 may be provided to help ensure a low resistance path to the semiconductor material of first semiconductor layer 418 across the entire photon detection device 440 or pixel.

The example depicted in FIG. 4B also illustrates potential contour lines with dashed lines, which show that the voltage potential is less negative in the first semiconductor layer 418 towards the center of photon detection device 440, and becomes more negative laterally extending outwards from the $V_{PIXEL}$ biased n+ doped region 424 of SPAD 410 towards the side regions 416. However, as shown in the example illustrated in FIG. 4B in comparison to the example illustrated in FIG. 4A, the voltage at the surface 438 of well region 430 in side regions 416 of the outside perimeter 432 is less negative than the high negative bias voltage $-V_{SUB}$, which appears at the surface 438 in the corner regions 414 as discussed above. As such, it is appreciated that this less negative potential at the well region surface 438 along the side regions 416 makes possible further reductions in the width of guard ring structure 434 to maintain the same lateral field near surface 438 in the corner regions 414.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A photon detection device, comprising:
    a single photon avalanche diode (SPAD) disposed in an active breakdown region of a first semiconductor layer;
    a guard ring structure disposed in the first semiconductor layer surrounding the SPAD to isolate the SPAD inside the guard ring structure;
    a well region disposed in the first semiconductor layer surrounding the guard ring structure and disposed along an outside perimeter of the photon detection device in the first semiconductor layer; and
    a contact region disposed in the well region only in a corner region of the outside perimeter such that there is no contact region disposed along side regions of the outside perimeter,
    wherein the well region is non-circular in shape in order to include the corner region and the side regions surrounding the guard ring structure such that a first distance between an inside edge of the guard ring structure and the contact region in the corner region of the outside perimeter is greater than a second distance between the inside edge of the guard ring structure and the side regions of the outside perimeter such that an electric field distribution is uniform around the photon detection device, wherein the first semiconductor layer comprises a p− doped epitaxial layer, wherein the well region comprises a p− doped semiconductor region, and wherein the contact region comprises a p+ doped semiconductor region.

2. The photon detection device of claim 1, wherein the contact region is a first contact region of a plurality of contact regions, wherein the corner region is a first corner region of a plurality of corner regions of the outside perimeter of the photon detection device, wherein each one of the plurality of contact regions is disposed in the well region only in a respective one of the plurality of corner regions of the outside perimeter such that there are no contact regions disposed along the side regions of the outside perimeter.

3. The photon detection device of claim 2, wherein the first distance is a contact distance between the inside edge of the guard ring structure and a respective one of the plurality of contact regions, wherein the contact distance is greater than the second distance between the inside edge of the guard ring structure and the side regions of the outside perimeter such that the electric field distribution is uniform around the photon detection device.

4. The photon detection device of claim 1, wherein the well region is provided with a retrograde p-well implant only along the side regions of the outside perimeter.

5. The photon detection device of claim 1, wherein the contact region in the corner region of the outside perimeter is coupled to a high negative bias voltage, wherein a surface voltage of the well region along the side regions of the outside perimeter is less negative than the high negative bias voltage.

6. The photon detection device of claim 1, wherein the inside edge of the guard ring structure includes an n− doped region surrounding the SPAD in the first semiconductor layer.

7. The photon detection device of claim 1, wherein the guard ring structure is laterally defined in the first semiconductor layer between the SPAD and the well region.

8. The photon detection device of claim 7, wherein the SPAD includes a multiplication junction defined at an interface between an n+ doped layer and a p doped layer of the SPAD in the active breakdown region.

9. The photon detection device of claim 1, wherein the SPAD is formed in a front side of the first semiconductor layer, and wherein the SPAD is optically coupled to receive the photons through a back side of the first semiconductor layer.

10. The photon detection device of claim 9, wherein the first semiconductor layer is included in a first semiconductor device wafer, wherein the first semiconductor device wafer is stacked with a second semiconductor device wafer including support circuitry coupled to the SPAD, and wherein the first and second semiconductor device wafers are coupled together in a stacked chip system.

11. The photon detection device of claim 1, wherein the contact region is shared with a second well region of a second photon detection device in the first semiconductor layer.

12. A photon sensing system, comprising:
a photon detection array having a plurality of photon detection devices, wherein each one of the photon detection devices includes:
a single photon avalanche diode (SPAD) disposed in an active breakdown region of a first semiconductor layer;
a guard ring structure disposed in the first semiconductor layer surrounding the SPAD to isolate the SPAD inside the guard ring structure;
a well region disposed in the first semiconductor layer surrounding the guard ring structure and disposed along an outside perimeter of the photon detection device in the first semiconductor layer; and
a contact region disposed in the well region only in a corner region of the outside perimeter such that there is no contact region disposed along side regions of the outside perimeter,
wherein the well region is non-circular in shape such that the well region includes the corner region and the side regions surrounding the guard ring structure, such that a first distance between an inside edge of the guard ring structure and the contact region in the corner region of the outside perimeter is greater than a second distance between the inside edge of the guard ring structure and the side regions of the outside perimeter such that an electric field distribution is uniform around the photon detection device, wherein the first semiconductor layer comprises a p− doped epitaxial layer, wherein the well region comprises a p− doped semiconductor region, and wherein the contact region comprises a p+ doped semiconductor region; and
a support circuitry coupled to the photon detection array to support operation of the photon detection array, wherein the support circuitry is disposed in a second semiconductor layer.

13. The photon sensing system of claim 12, wherein the first semiconductor layer is included in a first semiconductor device wafer, wherein the first semiconductor device wafer is stacked with a second semiconductor device wafer including the second semiconductor layer, and wherein the first and second semiconductor device wafers are coupled together in a stacked chip system.

14. The photon sensing system of claim 12, wherein the contact region is a first contact region of a plurality of contact regions, wherein the corner region is a first corner region of a plurality of corner regions of the outside perimeter of the photon detection device, wherein each one of the plurality of contact regions is disposed in the well region only in a respective one of the plurality of corner regions of the outside perimeter such that there are no contact regions disposed along the side regions of the outside perimeter.

15. The photon sensing system of claim 14, wherein the first distance is a contact distance between the inside edge of the guard ring structure and a respective one of the plurality of contact regions, wherein the contact distance is greater than the second distance between the inside edge of the guard ring structure and the side regions of the outside perimeter such that the electric field distribution is uniform around the photon detection device.

16. The photon sensing system of claim 12, wherein the well region is provided with a retrograde p-well implant only along the side regions of the outside perimeter.

17. The photon sensing system of claim 12, wherein the contact region in the corner region of the outside perimeter is coupled to a high negative bias voltage, wherein a surface voltage of the well region along the side regions of the outside perimeter is less negative than the high negative bias voltage.

18. The photon sensing system of claim 12, wherein the inside edge of the guard ring structure includes an n− doped region surrounding the SPAD in the first semiconductor layer.

19. The photon sensing system of claim 12, wherein the guard ring structure is laterally defined in the first semiconductor layer between the SPAD and the well region.

20. The photon sensing system of claim 19, wherein the SPAD includes a multiplication junction defined at an interface between an n+ doped layer and a p doped layer of the SPAD in the active breakdown region.

21. The photon sensing system of claim 12, wherein the SPAD is formed in a front side of the first semiconductor layer, and wherein the SPAD is optically coupled to receive the photons through a back side of the first semiconductor layer.

22. The photon sensing system of claim 12, wherein the contact region is coupled to a second well region of a second photon detection device in the first semiconductor layer.

* * * * *